(12) United States Patent
Gong et al.

(10) Patent No.: US 11,935,809 B2
(45) Date of Patent: Mar. 19, 2024

(54) SEMICONDUCTOR PACKAGE THERMAL SPREADER HAVING INTEGRATED EF/EMI SHIELDING AND ANTENNA ELEMENTS

(71) Applicant: NXP USA, INC., Austin, TX (US)

(72) Inventors: Zhiwei Gong, Chandler, AZ (US); Scott M. Hayes, Chandler, AZ (US); Michael B. Vincent, Chandler, AZ (US); Betty Hill-Shan Yeung, Chandler, AZ (US); Rushik P. Tank, Tempe, AZ (US); Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 18/064,607

(22) Filed: Dec. 12, 2022

(65) Prior Publication Data

US 2023/0106555 A1    Apr. 6, 2023

Related U.S. Application Data

(62) Division of application No. 17/330,336, filed on May 25, 2021, now Pat. No. 11,557,525.

(51) Int. Cl.
| | | |
|---|---|---|
| H01L 23/36 | (2006.01) | |
| H01L 21/48 | (2006.01) | |
| H01L 23/367 | (2006.01) | |
| H01L 23/552 | (2006.01) | |
| H01L 23/66 | (2006.01) | |

(52) U.S. Cl.
CPC ...... H01L 23/3672 (2013.01); H01L 21/4882 (2013.01); H01L 23/552 (2013.01); H01L 23/66 (2013.01); H01L 2223/6677 (2013.01)

(58) Field of Classification Search
CPC ............ H01L 23/3672; H01L 21/4882; H01L 23/552; H01L 23/66; H01L 2223/6677
USPC ............................................ 257/428; 438/57
See application file for complete search history.

(56) References Cited

U.S. PATENT DOCUMENTS

| | | |
|---|---|---|
| 7,361,972 B2 | 4/2008 | Chen |
| 9,431,316 B2 | 8/2016 | Pagaila |
| 2010/0019372 A1 | 1/2010 | Youn et al. |
| 2011/0149537 A1 | 6/2011 | Kurosawa et al. |
| 2012/0241941 A1 | 9/2012 | Kim et al. |
| 2013/0037931 A1 | 2/2013 | Higgins, III |
| 2014/0110840 A1 | 4/2014 | Wojnowski et al. |
| 2014/0213018 A1 | 7/2014 | Higgins, III et al. |
| 2015/0084178 A1 | 3/2015 | Kim et al. |

(Continued)

FOREIGN PATENT DOCUMENTS

JP    2016042582 A    3/2016

*Primary Examiner* — Didarul A Mazumder

(57) ABSTRACT

A cost-effective process and structure is provided for a thermal dissipation element for semiconductor device packages incorporating antennas that can incorporate RF/EMI shielding from the antenna elements. Certain embodiments provide incorporated antenna element structures as part of the same process. These features are provided using a selectively-plated thermal dissipation structure that is formed to provide shielding around semiconductor device dies that are part of the package. In some embodiments, the thermal dissipation structure is molded to the semiconductor device, thereby permitting a thermally efficient close coupling between a device die requiring thermal dissipation and the dissipation structure itself.

20 Claims, 12 Drawing Sheets

(56) References Cited

U.S. PATENT DOCUMENTS

| | | |
|---|---|---|
| 2015/0187675 A1 | 7/2015 | Tang et al. |
| 2017/0287805 A1 | 10/2017 | Ozawa et al. |
| 2017/0345736 A1* | 11/2017 | Miyairi ............... H01L 23/3672 |
| 2020/0152586 A1 | 5/2020 | Campos |
| 2020/0178415 A1* | 6/2020 | Kim ................... H05K 7/20454 |
| 2020/0203248 A1 | 6/2020 | Nair et al. |
| 2022/0216166 A1 | 7/2022 | Ojefors et al. |

\* cited by examiner

SEMICONDUCTOR PACKAGE THERMAL SPREADER HAVING INTEGRATED EF/EMI SHIELDING AND ANTENNA ELEMENTS

This application is a divisional application of a U.S. patent application entitled "SEMICONDUCTOR PACKAGE THERMAL SPREADER HAVING INTEGRATED EF/EMI SHIELDING AND ANTENNA ELEMENTS", having a serial number of Ser. No. 17/330,336, having a filing date of May 25, 2021, having common inventors, and having a common assignee, all of which is incorporated by reference in its entirety.

BACKGROUND

Field

This disclosure relates generally to semiconductor device packaging, and more specifically, to providing a heat sink or heat spreader incorporating radio frequency/electromagnetic interference shielding and antenna elements for a semiconductor device having one or more integrated antenna elements.

Related Art

Antenna technology and placement is one of the critical issues for 5G semiconductor systems. At millimeter wave (mmWave) frequencies, long paths from semiconductor packages to associated antennas would generate high signal losses, thereby making it desirable to integrate antenna into a semiconductor device package. So-called antenna-in-package (AiP) devices present unique challenges for semiconductor packaging technologies including, for example, miniaturization, thermal management, shielding, and antenna compatibility.

With an antenna integrated to a semiconductor device package, it is difficult to place a thermal dissipation structure without impacting antenna operations. In some devices, the antenna signal path is blocked by a standard heat sink. In other devices, a customized structure is provided that opens a window in the heat sink above the antenna region, but this leads to complex device assembly and can reduce the effectiveness of the heat sink.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention provide a cost-effective process and structure for a thermal dissipation element for semiconductor device packages incorporating antennas that can incorporate RF/EMI shielding from the antenna elements. Further embodiments can provide incorporated antenna element structures as part of the same process. These features are provided using a selectively-plated thermal dissipation structure that is formed to provide shielding around semiconductor device dies that are part of the package. In some embodiments, the thermal dissipation structure is molded to the semiconductor device, thereby permitting a thermally efficient close coupling between a device die requiring thermal dissipation and the dissipation structure itself.

Figure 1:
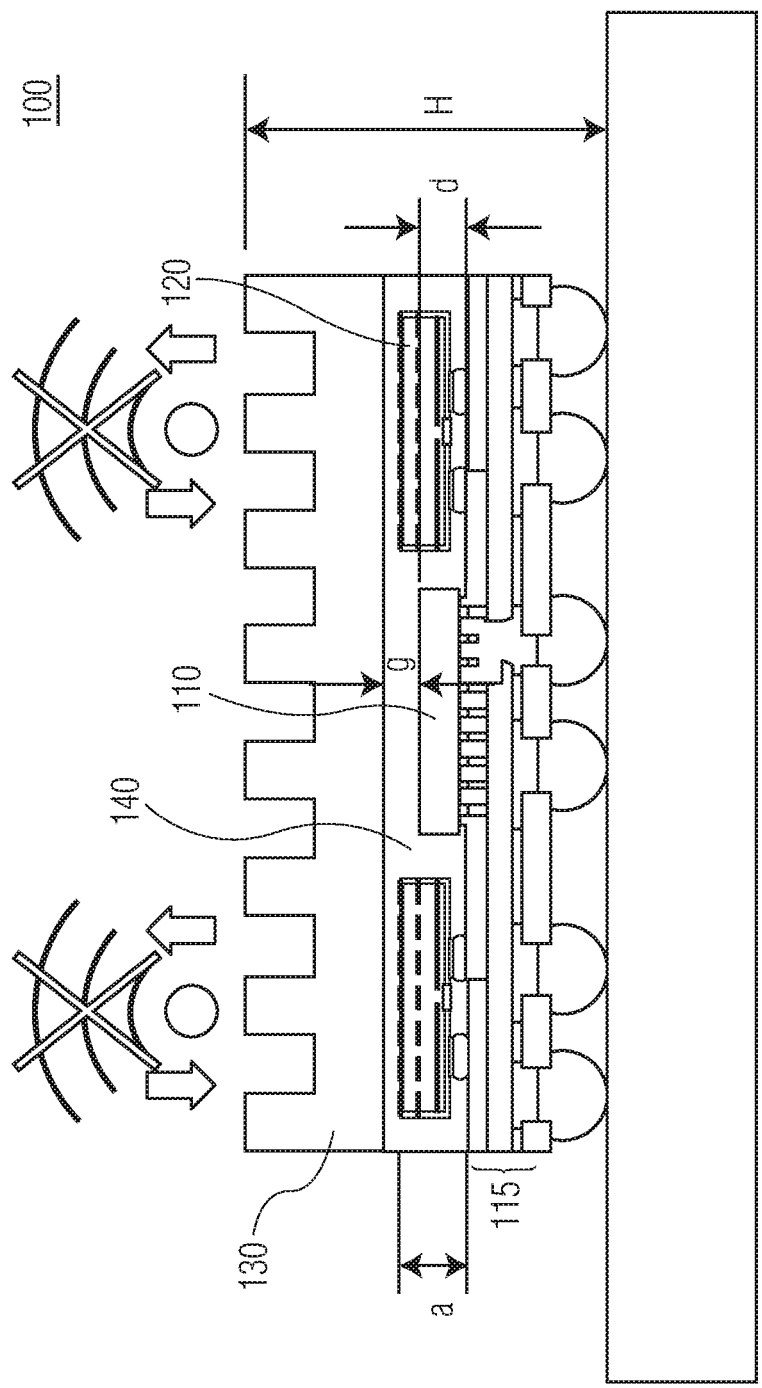
FIG. 1 is a simplified block diagram illustrating an example of a standard heat spreader attached to a flip chip (FC) package-based antenna-in-package (AiP).

FIG. 1 is a simplified block diagram illustrating an example of a standard heat spreader attached to a flip chip (FC) package-based antenna-in-package (AiP). FC is one of the packaging technologies that is well adapted to integrating antenna elements to a semiconductor device package. With antenna elements integrated to a semiconductor device package, there are difficulties in placing a thermal dissipation structure without impacting antenna operations.

Semiconductor device package 100 provides a semiconductor device die 110 mounted on a device substrate 115. As illustrated, the device substrate provides signal routing between semiconductor device die 110 and antennas 120 that are placed side-by-side with the semiconductor device die to allow wireless or RF signals to be transmitted through a top side of the package. In order to provide heat dissipation for semiconductor device die 110, a standard heat spreader 130 is illustrated as attached to the semiconductor device package molding material 140. Heat spreader 130 can be attached to the molding material using a thermally conductive material or a bonding material.

The semiconductor device package illustrated in FIG. 1 illustrates a few issues with such a structure. As an initial matter, the antenna signal path from antennas 120 is blocked by heat spreader 130. To provide a clear signal path, a window can be opened above the antenna structures in heat spreader 130, but this would lead to a customized heat spreader structure. Further, the thermal capacity of the heat structure would be compromised through the creation of such windows.

Another issue with the structure in FIG. 1 is associated with antenna thickness "a" above the surface of substrate 115, which is dictated by RF performance requirements. Thickness "a" can be on the order of hundreds of microns (e.g., 450 µm). This thickness, in turn, determines a thickness of mold compound 140 that equals a thickness "d" of semiconductor device die 110 (e.g., 400 µm) plus a top gap "g" (e.g., ~50 µm). But if a total thickness of "d" plus "g" is too large, effective heat dissipation from the active side of semiconductor device die 110 through heat spreader 130 will be negatively affected because thermal conductivity of both semiconductor device die 110 and mold material 140 is not as good as that of heat spreader 130. For effective heat dissipation, both the thickness "d" and top gap "d" should be minimized, but these are in turn constrained by antenna thickness "a". A further thickness related issue can relate to the total thickness "H" of the entire AiP structure being too large for some applications (e.g., fitting into a mobile device). As will be further discussed below, embodiments of the present invention overcome these issues.

Figure 2A:
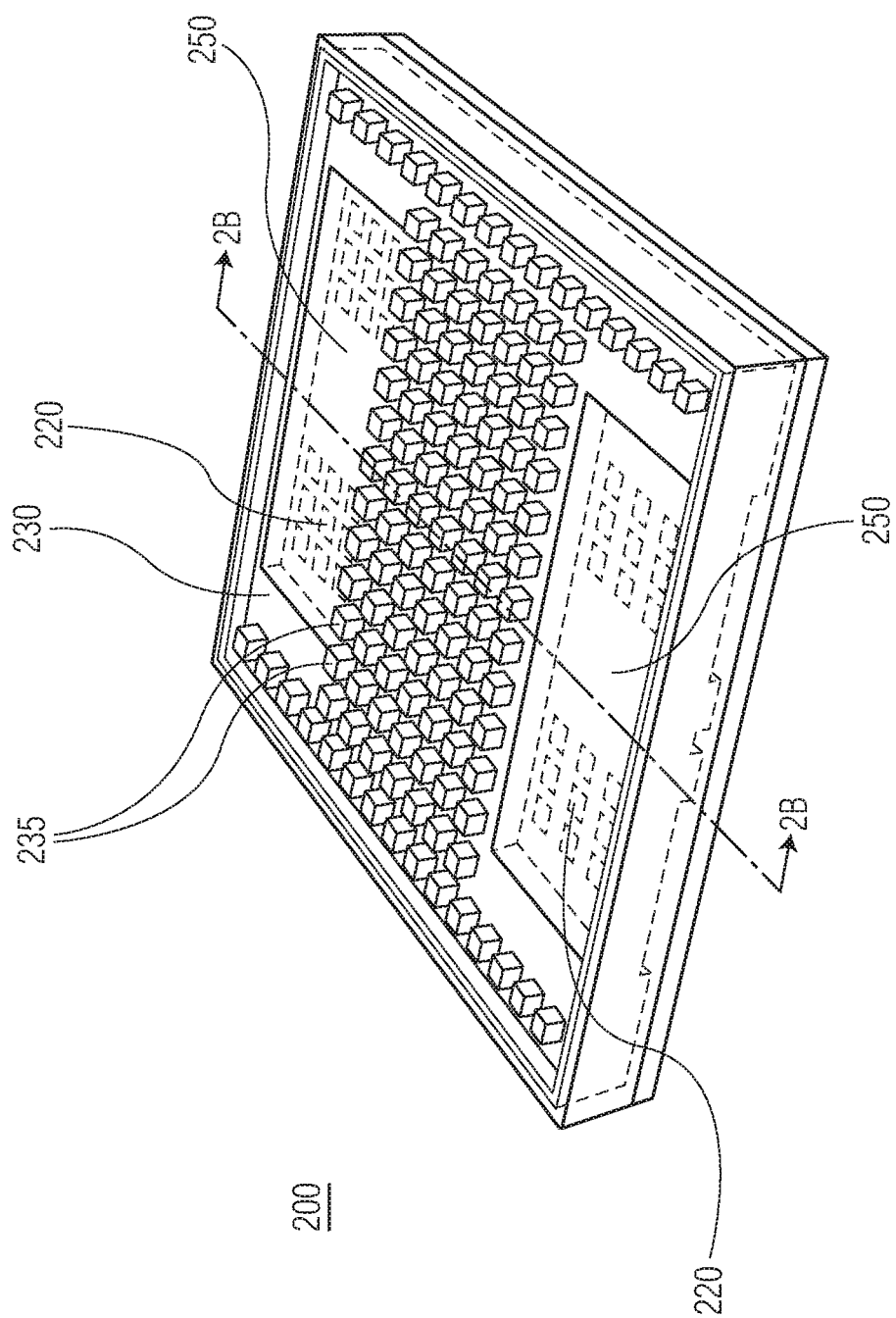
FIGS. 2A and 2B are simplified block diagrams illustrating a semiconductor device package 200 incorporating an example embodiment of the present invention.
Figure 2B:
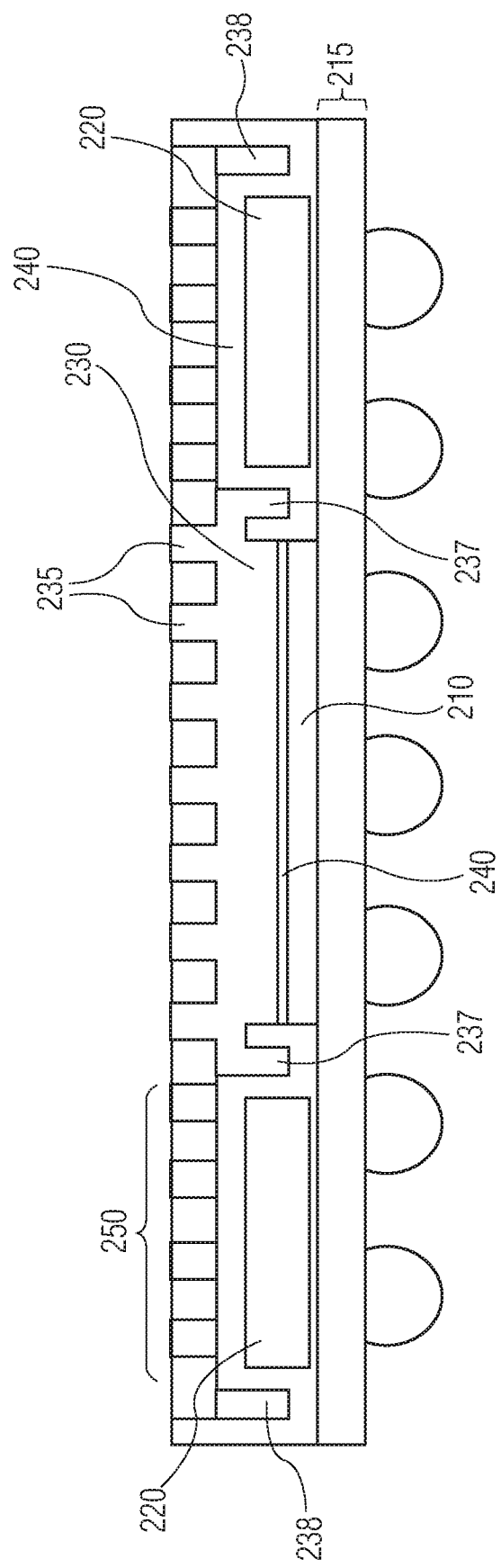

FIGS. 2A-2B are simplified block diagrams illustrating a semiconductor device package 200 incorporating an example embodiment of the present invention. Semiconductor device package 200 provides a semiconductor device die 210 mounted on a package substrate 215. As with the device illustrated in FIG. 1, the device substrate provides signal routing between semiconductor device die 210 and antenna structures 220 that are placed near the semiconductor device die for transmitting wireless or RF signals through a top side of the package.

In order to provide heat dissipation for semiconductor device die 210, a heat spreader element 230, configured in accord with embodiments of the present invention, is in thermal contact with semiconductor device die 210 through a thermal interface material (TIM) 240. Heat spreader element 230 is a thermally-conductive structure that includes structures 235 (e.g., fins or pins) that increase surface area on the portion of heat spreader element 230 to enhance heat dissipation. To allow wireless or RF signal transmission through the package from antenna structures 220, heat spreader element 230 also provides openings 250 in a region above the antennas. As will be discussed in greater detail below, openings 250 and structures 235 are formed using an etching process subsequent to attachment of heat spreader element 230 to the semiconductor device die 210 and the substrate.

As illustrated, heat spreader element 230 further includes shielding structures 237 and sidewall structures 238 that provide RF/EMI shielding between semiconductor device die 210 and antennas 220 and the outside environment. A mold compound 240 attaches heat spreader element 230 to the semiconductor device formed on substrate 215. A portion of the mold compound over antennas 220 is exposed by openings 250.

FIG. 2B illustrates some of the dimensional advantages of embodiments of the present invention. Semiconductor device die 210 and heat spreader element 230 can have significantly closer contact than in the semiconductor device package illustrated in FIG. 1. A surface of heat spreader element 230 is separated from the top surface of semiconductor device die 210 by only a thin layer of TIM 240, with no mold compound in that region. This close contact can be achieved regardless of the thickness of semiconductor device die 210, thereby allowing the die to be very thin and close contact to heat spreader element 230 through TIM 240 for efficient heat dissipation. This is not possible with the prior art structures of FIG. 1. In addition, overall package profile thickness "H" (from FIG. 1) can be significantly lowered with the heat spreader element provided by embodiments of the present invention.

Figure 3A:
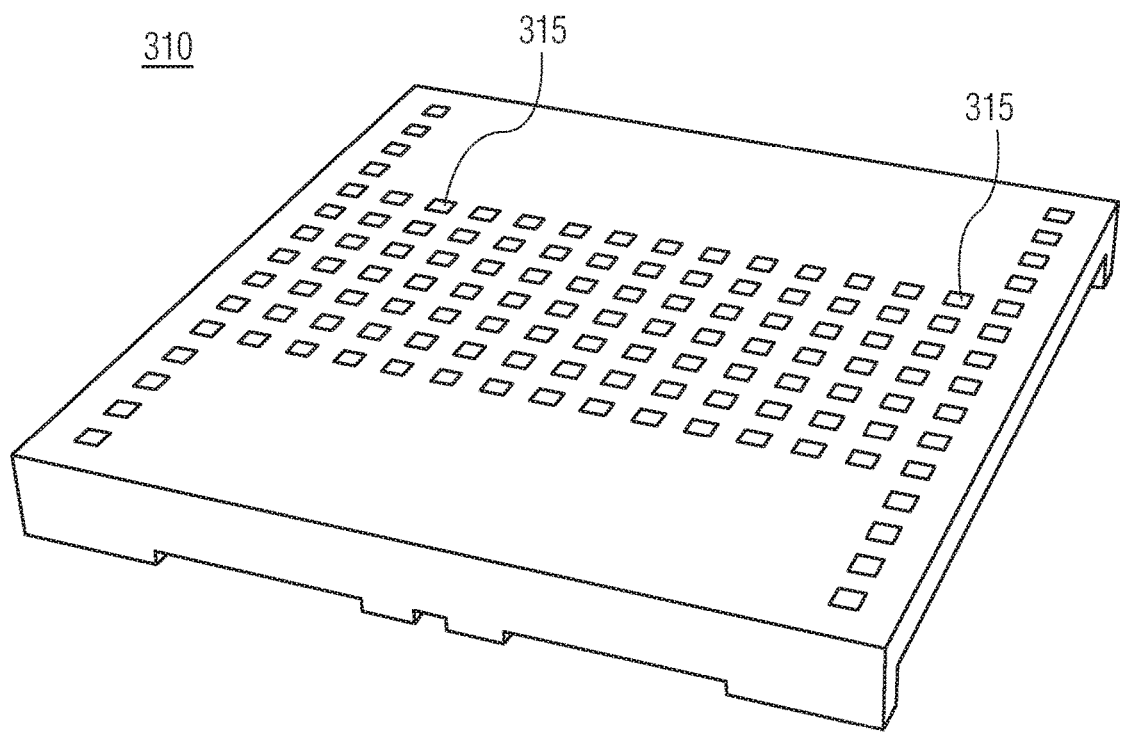
FIGS. 3A-3D are simplified block diagrams illustrating an example heat spreader element both before and after an etching process.
Figure 3B:
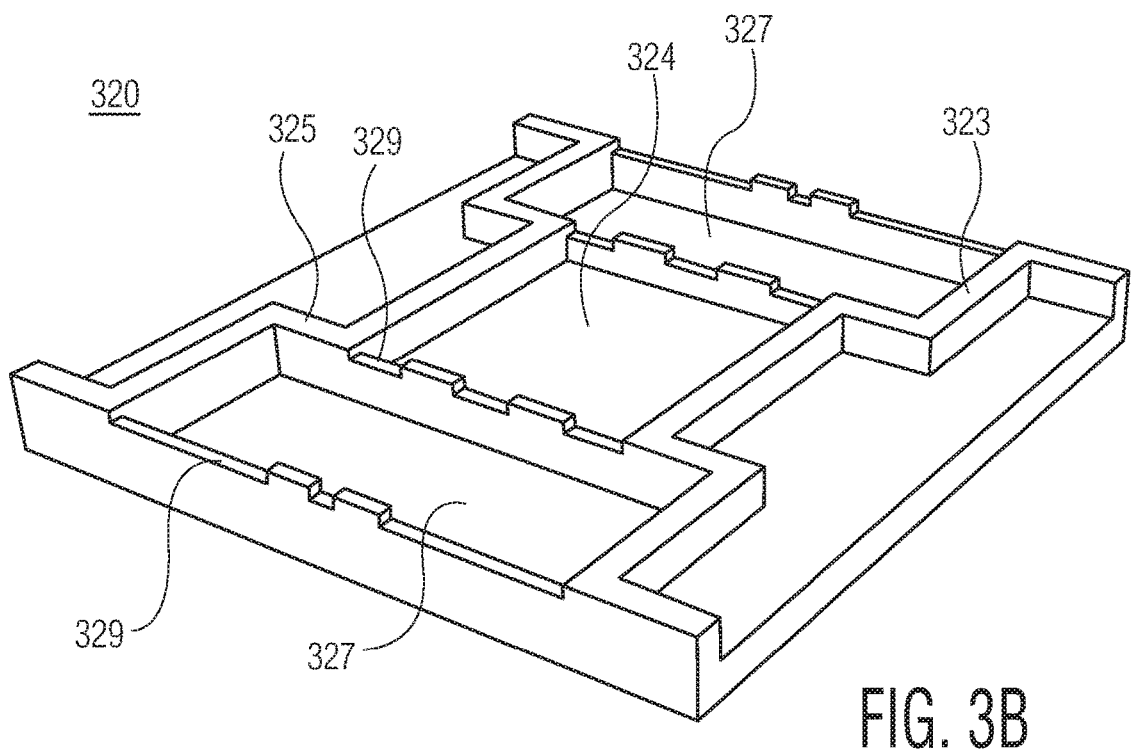

FIGS. 3A-3D are simplified block diagrams illustrating an example heat spreader element both before and after an etching process that results in both structures 235 and openings 250 discussed above with regard to FIGS. 2A and 2B. FIGS. 3A and 3B provide an example top and bottom view, respectively, of the example heat spreader element prior to etching. While heat spreader element 230 can be prepared from a range of metals or metal alloys (e.g., aluminum or stainless steel) compatible with semiconductor packaging, copper satisfies thermal capacity and ease of etching criteria for many applications. The heat spreader element can be formed using lead frame or heat sink manufacturing techniques known in the art. Specifically, stamping or etching can be used to create desired structures for shielding, such as a shield structures 323 and 325 around region 324 where one or more semiconductor device die will be located when the heat spreader element is assembled with a semiconductor device. Additional structures formed on the bottom-side surface can include openings 329 for mold compound (e.g., mold compound 240) to be applied between a semiconductor device and the heat spreader element.

Selective plating (e.g. 315) on the topside of the heat spreader element can be applied with standard lead frame plating processes. This selective plating can be applied using a standard pre-plated finish (PPF) technique (e.g., NiPd or other type inert-to-metal etchants) that is applied to the areas of the heat spreader element to be kept during subsequent etching, as will be discussed more fully below. A typical, low-cost lead frame etching process is applicable for metal etching of embodiments of the present invention. If copper is used for the heat spreader element, chemicals such as persulfate salt (e.g., ammonium persulfate), ferric chloride, hydrochloric acid, or hydrogen peroxide can be used for the etching process.

Figure 3C:
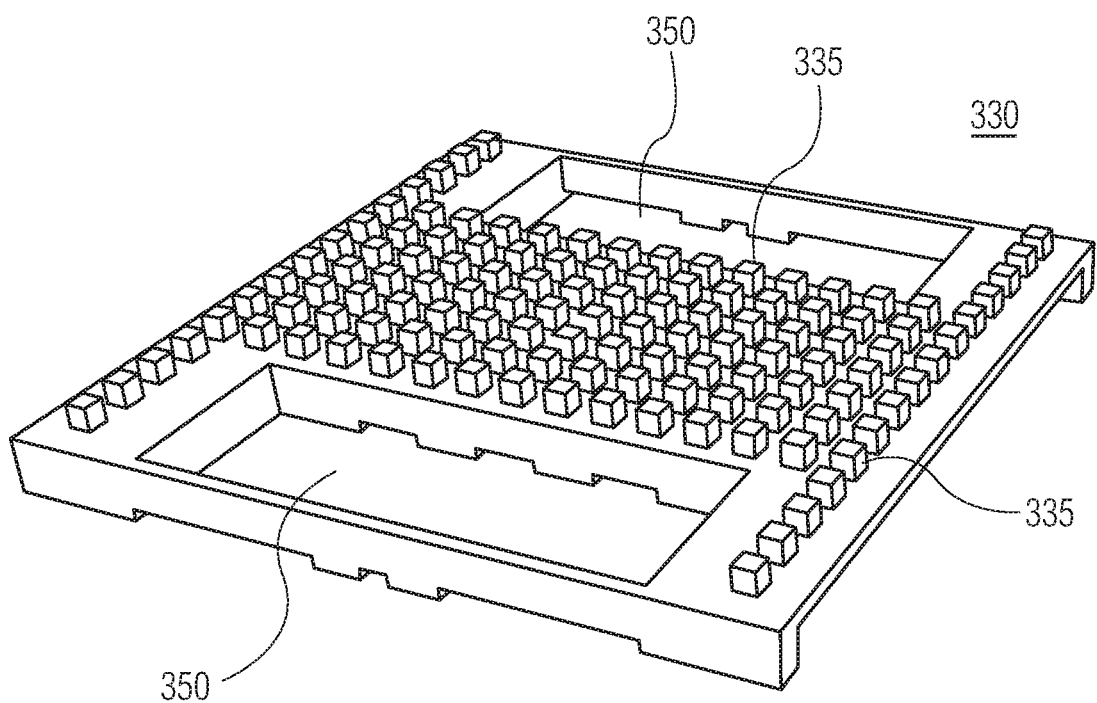
Figure 3D:
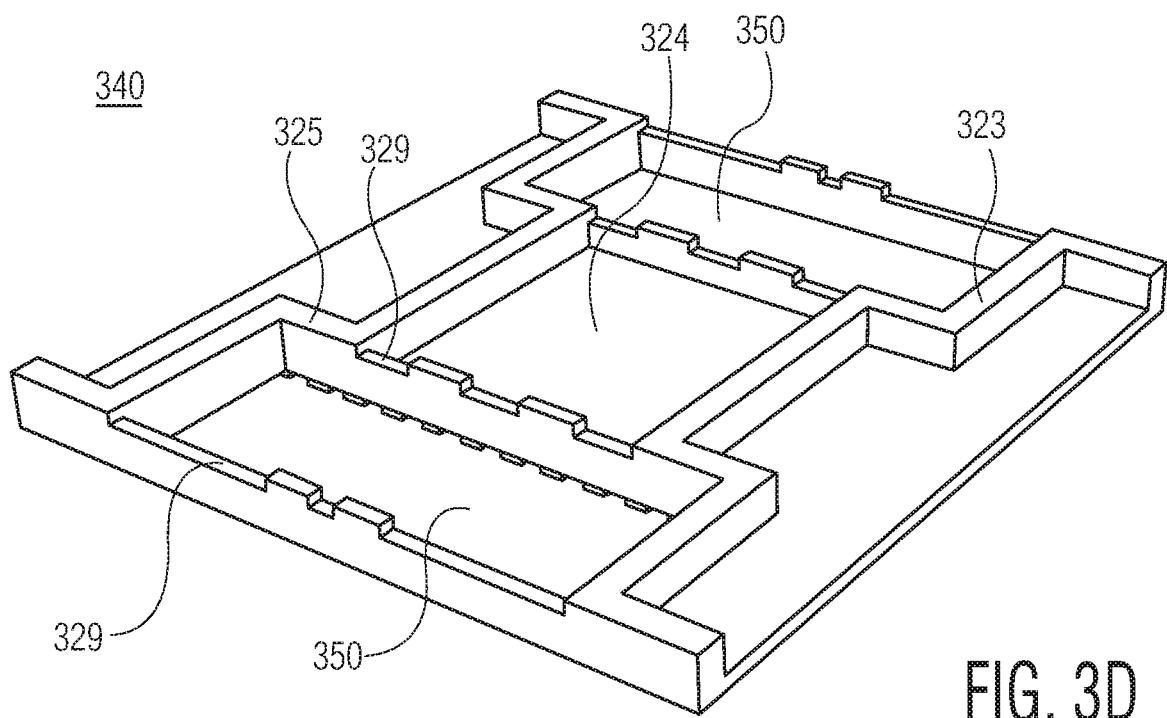

FIGS. 3C and 3D provide an example top and bottom view, respectively, of the heat spreader element subsequent to etching. Metal is removed from the heat spreader element creating topside structures 335 in the regions where selective plating 315 was applied. These structures provide additional surface area on the portion of the heat spreader element relied upon to dissipate heat from a semiconductor device die in contact with the bottom surface of the heat spreader element. In addition, openings 350 are created during etching of thinner metal regions 327 formed during the initial formation of the heat spreader element. Openings 350 in the heat spreader element are created to permit transmission of RF signals from antenna structures associated with a semiconductor device attached to the heat spreader element.

Figure 4A:
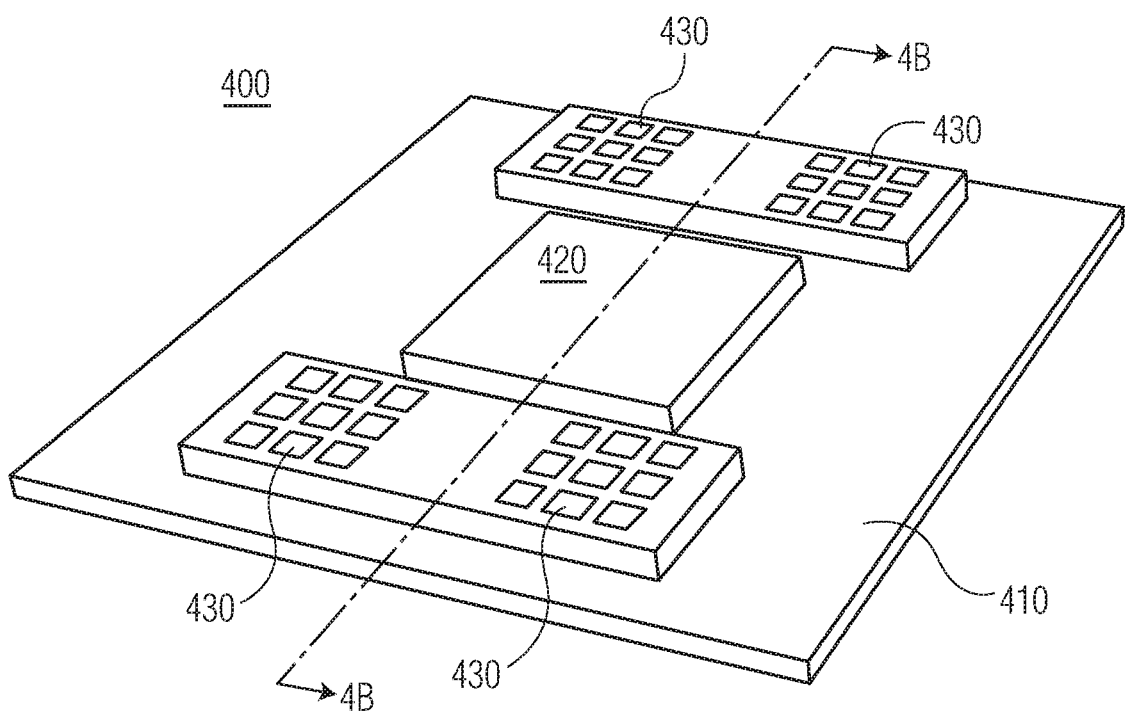
FIGS. 4A through 8B illustrate an example process flow used for manufacturing embodiments of the present invention.

FIGS. 4A through 8B illustrate an example process flow used for manufacturing embodiments of the present invention. As illustrated, the top image of each figure is a perspective plan view of each stage in processing, while the bottom image of each figure is a cross section view of that same stage of processing. FIGS. 4A and 4B illustrate a semiconductor device 400 having a semiconductor device die 420 and two antenna structures 430 attached to a package substrate 410. In operation, such a semiconductor device would have signals generated by semiconductor device die 420 provided to antenna structures 430 for RF transmission in a direction extending vertically away from the top surface of the antenna structures.

In the embodiments shown in FIGS. 4A through 8B, semiconductor device die 420 is a flip chip die, having active side in a face-down orientation toward the top surface of package substrate 410. The semiconductor die active side can include active circuitry and a plurality of die pads connected to the active circuitry, where the die pads of semiconductor device die 420 are attached (e.g., mechanically attached and electrically connected) through solder bumps to landing pads on the package substrate. Some (up to and including all) of the plurality of die pads are connected to a signal line of active circuitry that may carry either a radio frequency (RF) signal or may carry a non-RF signal (e.g., a power supply signal like Vss or Vdd). The RF signal may be carried by a conductive path coupled between a respective die pad and antenna 430 through package substrate 410, where the RF signal may be transmitted from or received on antenna 430. It should be noted that embodiments are not limited to flip chip die configurations, as discussed herein.

Semiconductor device die 420 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, MEMS (microelectromechanical systems) device, a stand-alone discrete device such as a resistor, inductor, capacitor, diode, power transistor, and the like. When semiconductor device die 420 operates, heat is generated at the active side of the die. It is therefore desirable to make the die thin so that excess heat can conduct to TIM 240, for example, and then to heat spreader 235 effectively.

It is noted that in embodiments of the present invention, the active circuitry of semiconductor device die 420 includes a radio frequency (RF) block that implements an RF transmitter, an RF receiver, or both. In some embodiments, RF signals are transmitted, received, or both, via an antenna on the resulting device (e.g., on package substrate 410) that is communicatively coupled to the active circuitry of semiconductor device die 420 (e.g., through one or more external electrical connections between the die and the package substrate). The RF block may implement front-end components of the RF transmitter, RF receiver, or both, where the front-end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front-end elements. The front-end components of the RF block may have configurable settings to adjust the transmit signal or receive signal. In some embodiments, the RF block may have an operating frequency that falls within a frequency band range of from a few hundred megahertz to tens of gigahertz, although other operating frequencies that fall within other radio frequencies may be implemented in other embodiments.

Figure 4B:
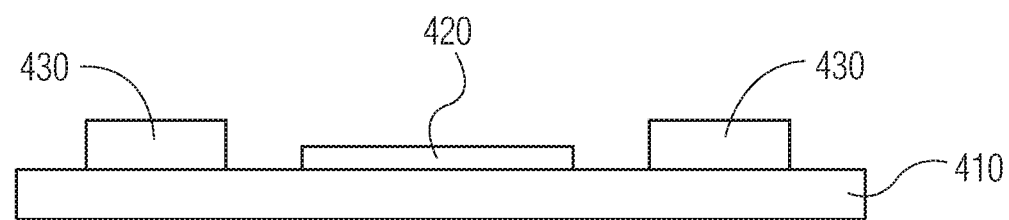
Figure 5A:
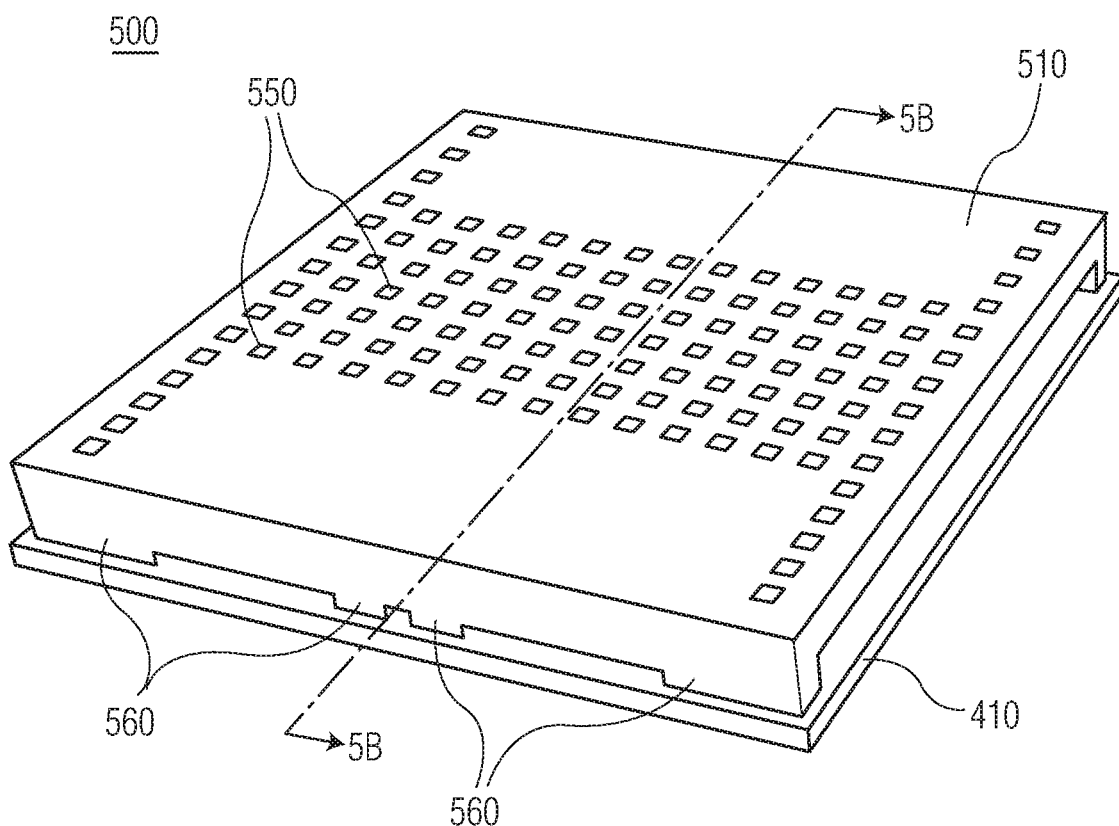
Figure 5B:
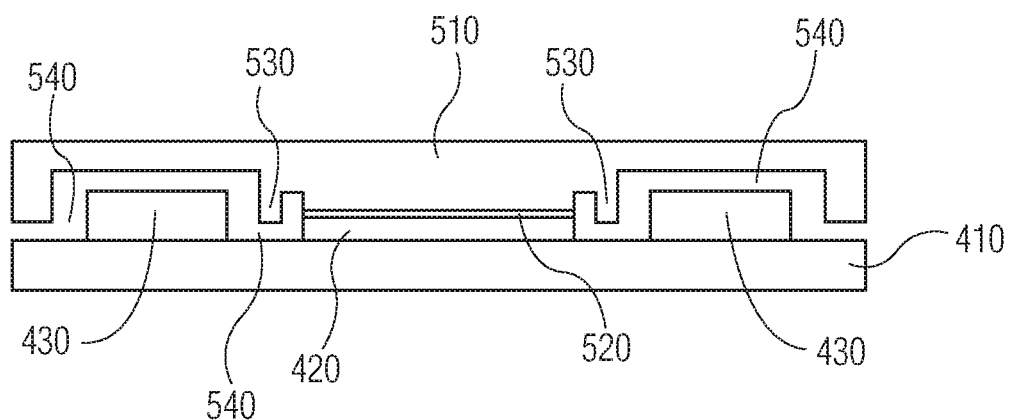

FIGS. 5A and 5B illustrate a next stage in the example process flow subsequent to that illustrated in FIGS. 4A and 4B. A heat spreader element 510 is thermally coupled to semiconductor device die 420 using a thin layer of thermal interface material 520. Such a thermal interface material can include, for example, a thermal paste that includes aluminum oxide, boron nitride, zinc oxide, or aluminum nitride, or a thermal adhesive. The attachment process can be a surface mount or epoxy attach, for example. In some embodiments, a strip of heat spreader elements 510 can be applied to a corresponding set of semiconductor devices. As discussed above with regard to FIG. 3, structures formed on the semiconductor device side facing surface of heat spreader element 510 can form, for example, RF/EMI shield regions 530 and openings 540 for mold compound to be applied between the spreader element and the semiconductor device. In some embodiments, heat spreader element 510 is desired to connect to a ground of package substrate 410 for RF/EMI shielding. This connection can be provided using, for example, conductive paste material or other conductive bonding materials applied at substrate contact points 560. Heat spreader element 510 further includes selectively plated regions (e.g., plated regions 550) that will define areas that will not be etched during a subsequent etching process, to be described below.

Figure 6A:
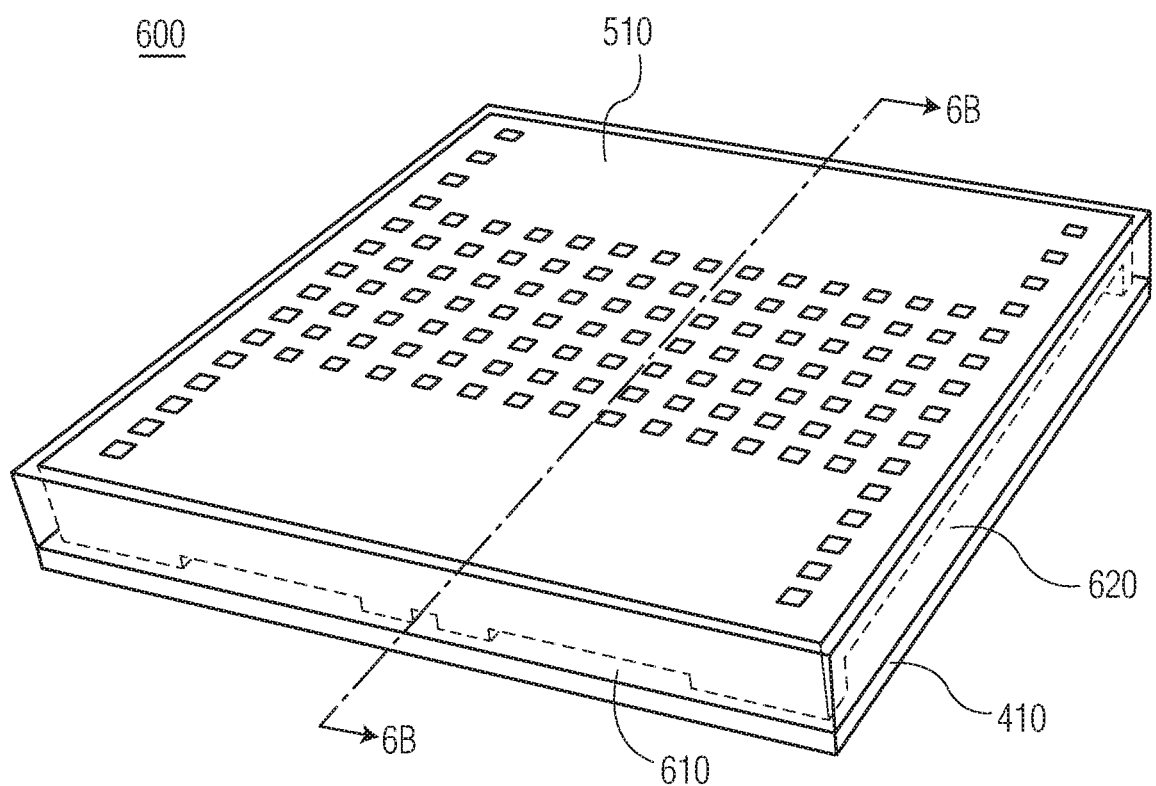
Figure 6B:
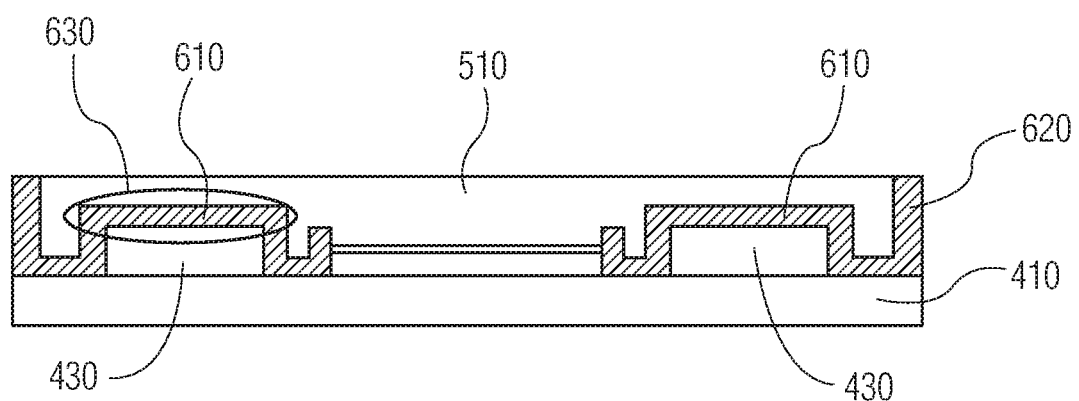

FIGS. 6A and 6B illustrate a next stage in the example process flow subsequent to that illustrated in FIGS. 5A and 5B. A mold compound 610 is applied to the region between heat spreader element 510 and the semiconductor device formed on substrate 410 that includes openings 540. The mold compound also is formed in a perimeter region 620 around heat spreader element 510, which can be exposed during separation of neighboring packages on a strip. In one embodiment, film-assisted molding can be used to provide a resin-bleed free molding process. It should be noted that the thickness of the mold over the antenna elements (for example, in region 630) can be adjusted through the design of heat spreader element 510. The thickness of the mold over the antenna elements can have an effect on the RF performance of the antenna elements, and therefore is selectable for a particular application. The thickness of the mold compound over the antenna elements cannot be independently modified in prior art devices, and can affect the heat remediation characteristics of the heat spreader in such devices by increasing gap "g."

Figure 7A:
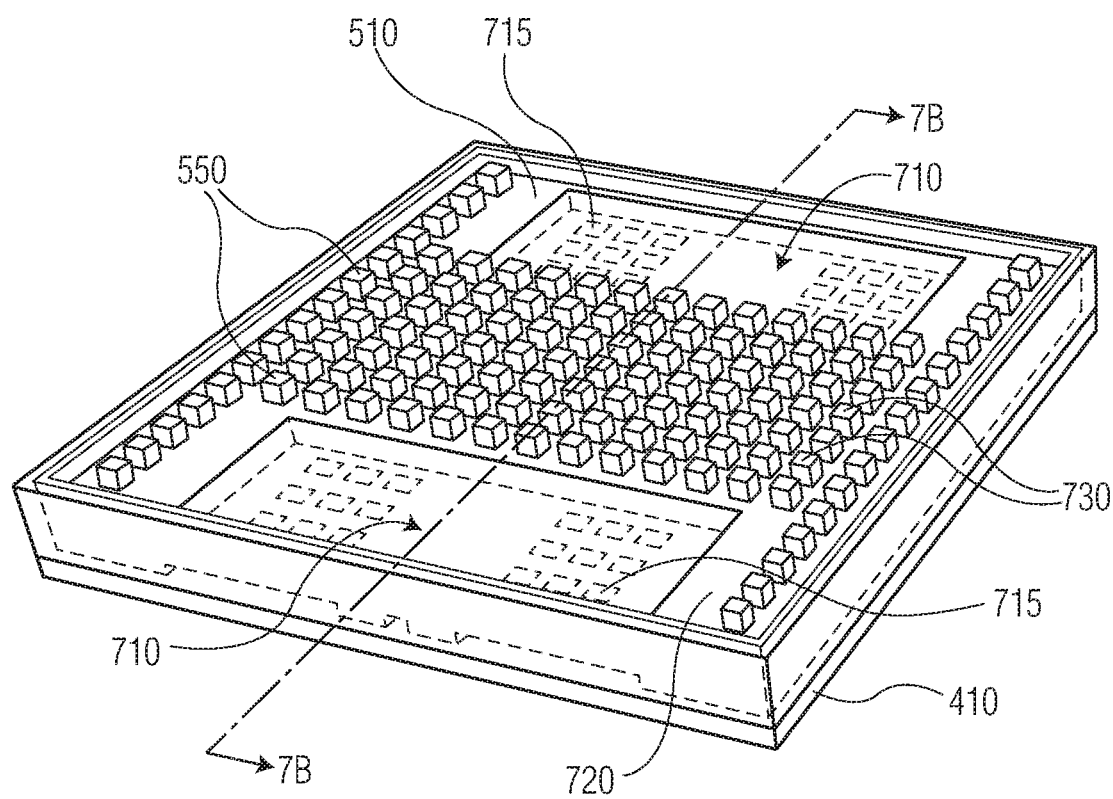
Figure 7B:
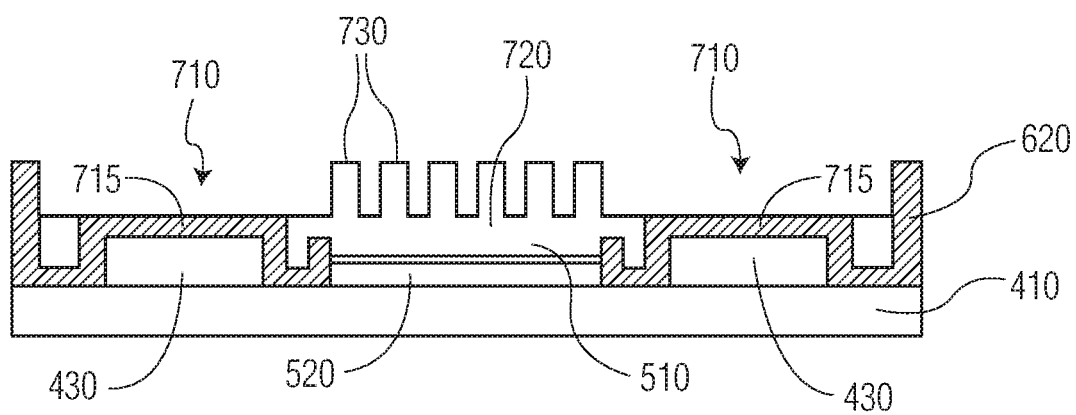

FIGS. 7A and 7B illustrate a next stage in the example process flow subsequent to that illustrated in FIGS. 6A and 6B. An entire strip of multiple packages can be subjected to a metal etching process. Since heat spreader element 510 is prepared with selective plating 550 on the exposed topside of the heat spreader element, only exposed space metal will be etched off during the etching process, while the plating finish is inert to etchant and acts as an etching mask. Metal in regions above antenna elements 430 is totally removed during etching, creating antenna openings 710 that will expose molding above antenna elements 715 and allow an RF signal from the antenna elements to be transmitted during operation of the semiconductor device. The etching process also creates structures (e.g., 730) that increase surface area of heat spreader 720 for more efficient heat dissipation from semiconductor device die 420. The etching process can be performed in a batch process in strip form using established semiconductor or lead frame processes in a high efficiency and low-cost manner.

Figure 8A:
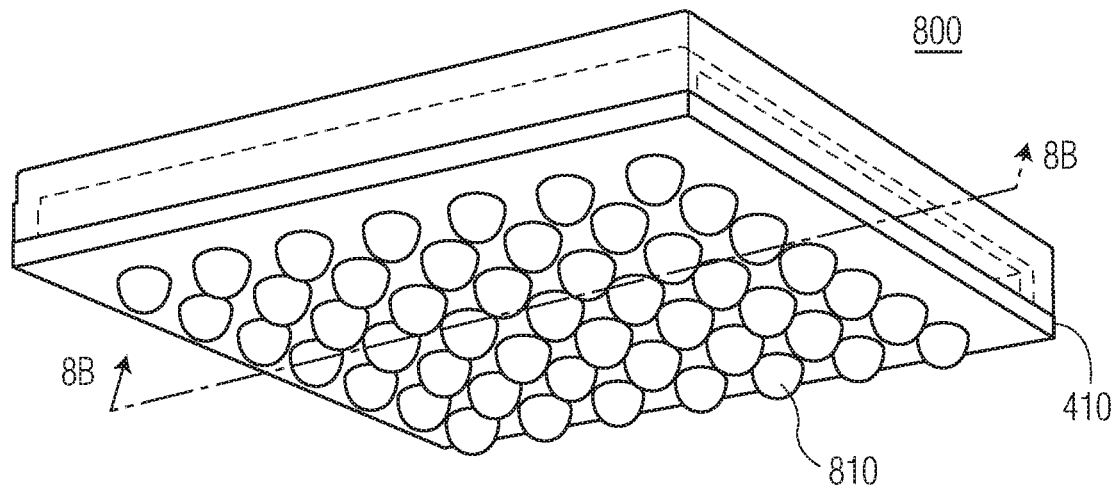
Figure 8B:
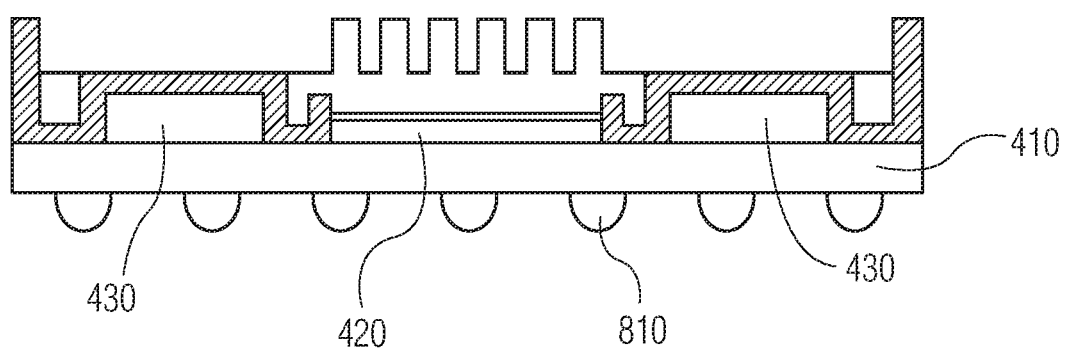
Figure 9A:
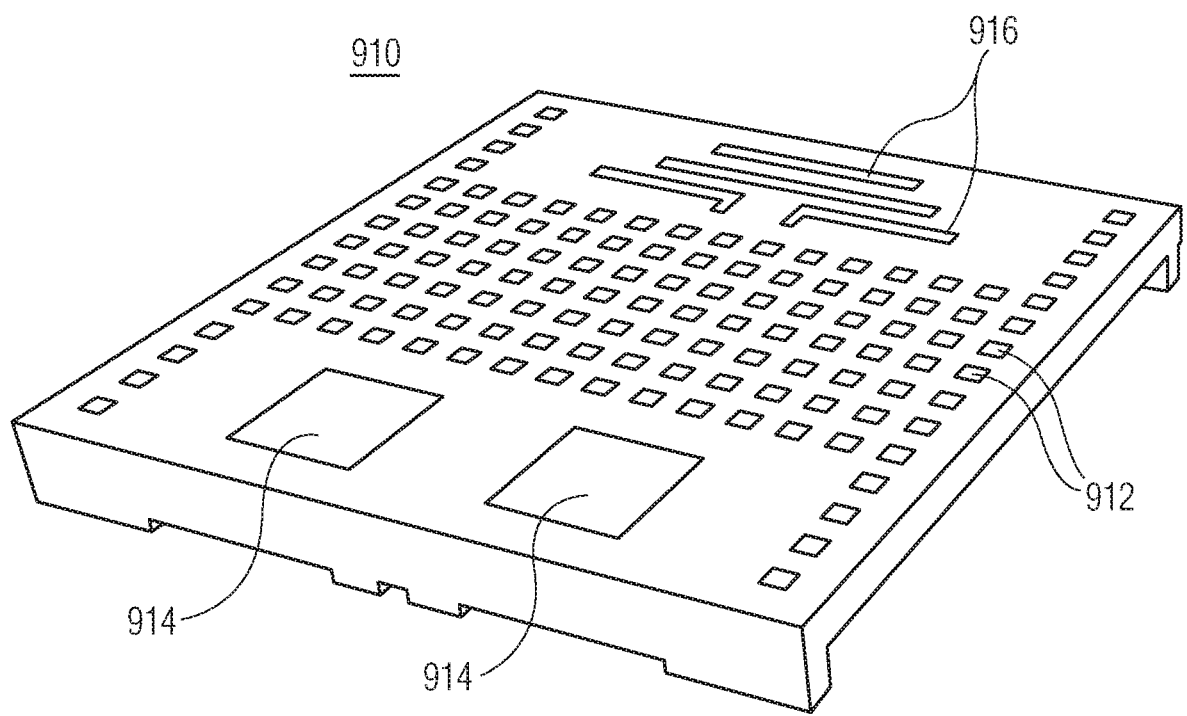
FIGS. 9A-9D illustrate an alternate embodiment of a heat spreader element with integrated antenna element structures, in accord with embodiments of the present invention.
Figure 9B:
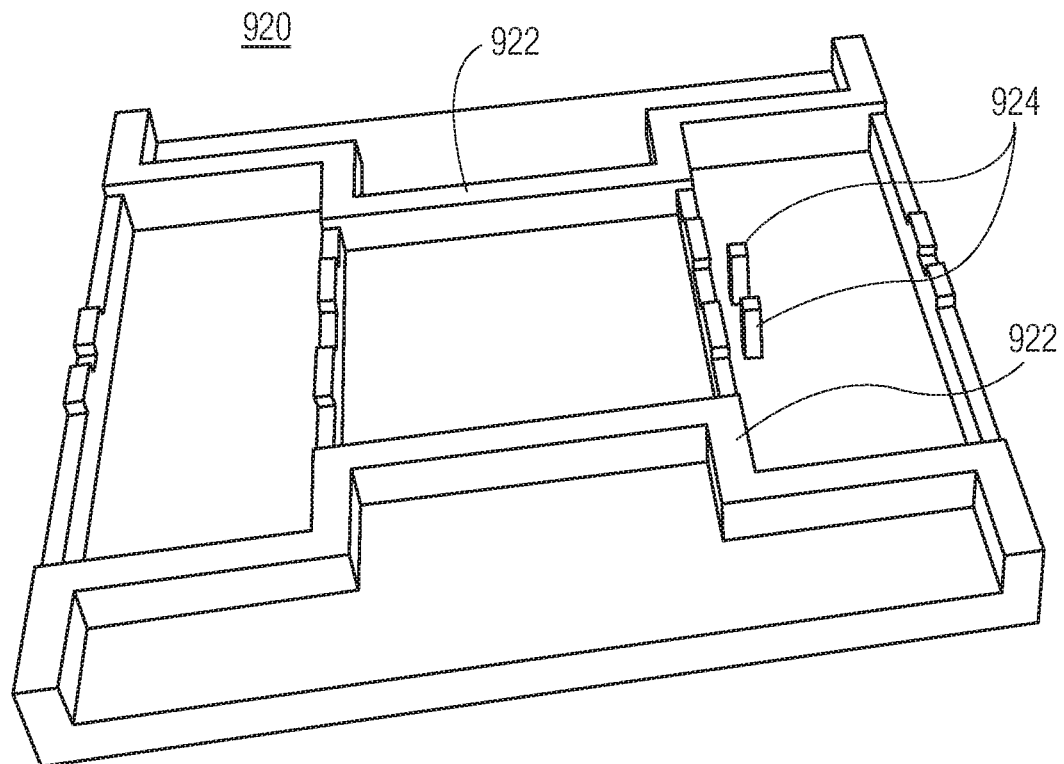
Figure 9C:
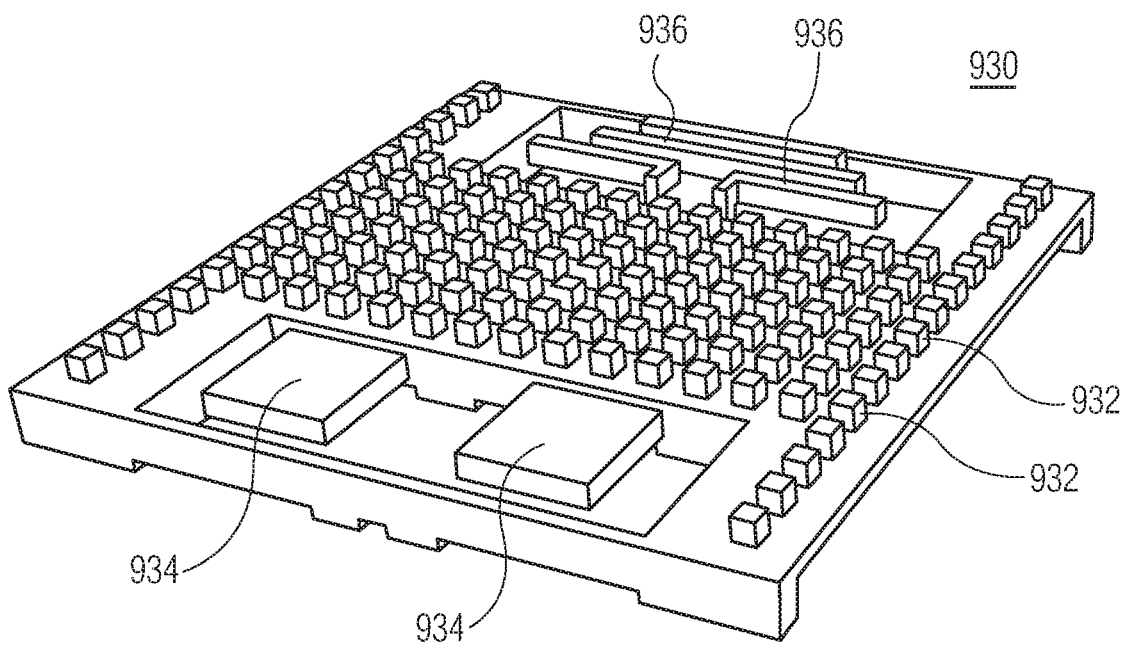
Figure 9D:
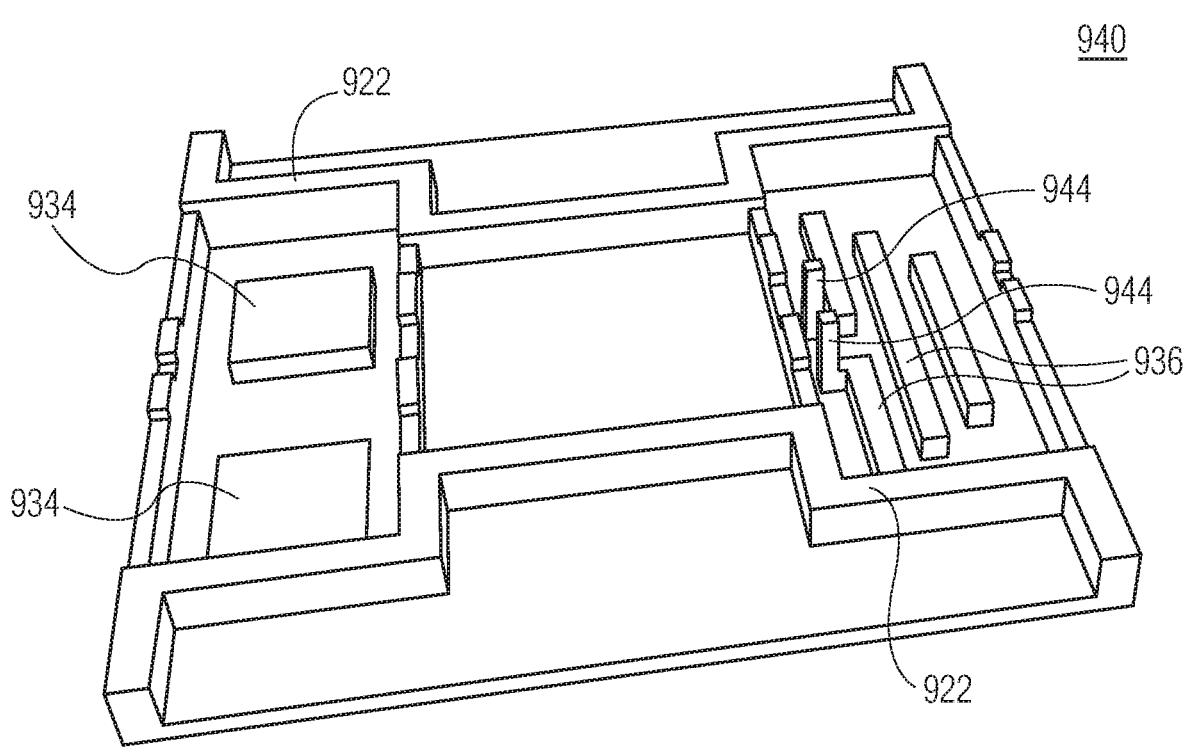

FIGS. 8A and 8B illustrate a next stage in the example process flow subsequent to that illustrated in FIGS. 7A and 7B. As illustrated, solder balls or other contacts 810 are added to semiconductor device package 800. At this stage, other processes such as marking and singulation can be performed to complete the semiconductor device package. Other processes, such as metal finish or a coating layer can be applied before singulation, if necessary, to protect the base metals from environmental effects.

The process discussed above with regard to FIGS. 4A-8B is illustrated using Flip Chip-Chip Scale Packaging (FC-CSP) packaging with an added etching process. It should be noted that the semiconductor device structure is not limited to FC-CSP, but can be used with multiple lead frame, substrate-based packages (e.g., WB-CSP, FC-Q FN, and the like), and fan-out wafer level or panel-level packages. In addition, while the illustrations show square patterns used for plating finish 550, other shapes and different sizes can easily be defined through the selective plating process. Thus, the number, shape, size, and placement of plated regions can be selected in light of the application, and regions desired for enhanced thermal dissipation.

FIGS. 9A-9D illustrate an alternate embodiment of a heat spreader element, in accord with embodiments of the present invention. An advantage of using etching to provide structures on the heat spreader element and openings is that other structures can be formed by selectively plating. For example, antennas can be formed from the metal of the heat spreader element and connecting structures for those antennas can be formed during either etching or initial formation of the heat spreader element (e.g., stamping). In so doing, antenna elements 430, for example, can be eliminated from the semiconductor device package.

Illustration 910 (FIG. 9A) shows a top surface of a heat spreader element prior to etching. Selective plating 912 on the top surface is used to form heat spreader structures, as illustrated above. In addition, selective plating is provided to form specialized antenna structures. For example, selective plating 914 is in a shape and region to provide a patch antenna structure. As another example, selective plating 916 is in a shape and region to provide a dipole antenna structure.

Illustration 920 (FIG. 9B) shows a bottom view of the heat spreader element of illustration 910, again prior to etching. In addition to shielding structures 922, there are also formed dipole feeds 924, in a region beneath selective plating 916. The dipole feeds are a mechanism for a semiconductor device associated with the heat spreader element to provide signals to the dipole antenna formed during etching.

Illustration 930 (FIG. 9C) shows a top surface view of the heat spreader subsequent to etching, in which structures 932 are formed, as discussed above. In addition, in one antenna region, patch antennas 934 are formed where selective plating 914 was applied. In another antenna region, dipole antenna 936 is formed where selective plating 916 was applied.

Illustration 940 (FIG. 9D) shows a bottom surface view of the etched heat spreader of illustration 930. Dipole feeds 944 are shown attached to formed dipole antenna 936. In addition, the bottom surface of patch antennas 934 is shown, along with shielding structures 922. Formation of a semiconductor device package incorporating the heat spreader element of FIG. 9 can follow a similar process flow to that discussed above with regard to FIGS. 4-8. An additional step that may be used with the heat spreader element of FIG. 9 is inclusion of alignment features (e.g., fiducials) to ensure that the dipole antenna feeds and patch antennas are properly located to contacts on the associated semiconductor device when the heat spreader element is attached to the semiconductor packaging substrate. It should be realized that antenna structures formed using the metal of the heat spreader element are not limited to the patch antenna and dipole antenna illustrated and can take any appropriate shape and structure as suggested by the application.

Embodiments of the present invention provide a mechanism by which a heat spreader element can be added to a semiconductor device package with low cost and few process modifications. Heat spreading structures on the device-facing side of the heat spreader are formed prior to inclusion of the heat spreader on the semiconductor device. So too is selective plating provided prior to assembly. Once added to the semiconductor device die, only an additional etching step is needed as compared with standard semiconductor packaging technologies.

In addition, embodiments provide dimensional advantages over prior art heat spreading structures. Embodiments can provide a significantly lower package profile ("H" from FIG. 1) than prior art devices due to embedding the heat spreader itself into the package. Embodiments also provide a close contact between a thin semiconductor device die (e.g., semiconductor device die 210) and the heat spreader element, and allow for the die thickness to be thin, which allows for improved heat dissipation from the device die. This improved heat dissipation is provided in spite of the introduction of openings over the antenna structures. Further, the thickness of the mold over the antenna structures can be tuned by modifying the heat spreader element design (e.g., modifying the width of the gaps in region 540 without concern for affecting thermal dissipation from the semiconductor device die. This can have a significant effect on RF performance of the antenna structures.

Embodiments also provide flexibility in whether to include antenna elements as part of the heat spreader element, as shown in FIGS. 9A-9D, and also in the shape, number, and depth of the structures on the non-die facing portion of the heat spreader element. As another example, a metal separation can be kept in the antenna window region to provide multi-channel antenna isolation. The shielding structures can also be included to have RF/EMI shielding to the die and antennas.

By now it should be appreciated that there has been provided a method for forming a semiconductor device package. The method includes thermally coupling a portion of a first major surface of a heat spreader element to an exposed surface of a semiconductor device die of a semiconductor device, applying a mold compound to a gap region between the first major surface of the heat spreader element and an exposed surface of the semiconductor device, and etching a second major surface of the heat spreader element subsequent to applying the mold compound. The second major surface of the heat spreader element includes selective plating in a region opposite the portion of the heat spreader element in thermal contact with the semiconductor device die. The etching forms one or more structures in the selectively plated portion of the second major surface. The etching forms a heat spreader in contact with the semiconductor device die.

In one aspect of the above embodiment, thermally coupling includes using a thermally conductive material between the exposed surface of the semiconductor device die and the portion of the first major surface of the heat spreader element. In another aspect, the semiconductor device includes one or more antenna contacts, the second major surface of the heat spreader element includes antenna selective plating in regions corresponding to the one or more antenna contacts, and the etching forms an antenna structure in the regions under the antenna selective plating.

In yet another aspect of the above embodiment, the method further includes forming the heat spreader element from a thermally-conductive metal where the forming includes one of stamping or etching. In a further aspect, forming the heat spreader element further includes forming one or more shielding structures on the first major surface of the heat spreader element. In a still further aspect, the one or more shielding structures are configured to provide electromagnetic shielding between devices include on a substrate of the semiconductor device package.

In another aspect of the above embodiment, the structures are configured to enhance thermal dissipation characteristics of the heat spreader. In yet another aspect, the method further includes attaching contacts to a bottom-side major surface of the semiconductor device package after the etching. In another aspect, the heat spreader element is one of a strip of heat spreader elements applied to a corresponding set of non-singulated semiconductor devices. In a further aspect, the method further includes singulating the semiconductor device package after the etching.

Another embodiment provides a semiconductor device package that includes a package substrate, a semiconductor device die having first and second opposing major surfaces where the first major surface is mounted to the package substrate, and a heat spreader element that has first and second major surfaces. The heat spreader element is made of a thermally and electrically conductive material. A first portion of the first major surface of the heat spreader element is thermally coupled to the second major surface of the semiconductor device die. The heat spreader element includes a plurality of structures formed on the second opposing major surface of the heat spreader element in a region opposing the portion of the first major surface coupled to the semiconductor device die. The heat spreader element further includes one or more openings formed through the heat spreader element in a portion of the semiconductor device package having an antenna structure.

In one aspect of the above embodiment, the semiconductor device package further includes a mold compound formed in a region between the first major surface of the heat spreader element and elements of the semiconductor device package mounted on the package substrate. In a further aspect, the one or more openings in the heat spreader element expose a surface of the mold compound.

In another aspect of the above embodiment, the semiconductor device package further includes one or more antenna elements mounted on the package substrate. Each antenna element is located in a region under a corresponding opening in the heat spreader element where each antenna element is configured to transmit an RF or wireless signal through the corresponding opening. In still another aspect, the semiconductor device package further includes one or more antenna elements formed from the thermally and electrically conductive material. Each antenna element is located in a region of a corresponding opening in the heat spreader element where each antenna element is configured to transmit an RF or wireless signal. In a further aspect, the one or more antenna elements are formed during and etching process of the heat spreader element and the plurality of structures are formed during the etching process of the heat spreader element.

In still another aspect of the above embodiment, the heat spreader element further includes one or more shield structures formed on a second portion of the first major surface of the heat spreader element where the shield structures are configured to electromagnetically shield the semiconductor device die and the shield structures are formed from the heat spreader material. In yet another aspect, the semiconductor device package further includes a thermally-conductive material between the semiconductor device die and the first portion of the first major surface of the heat spreader element.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, the shape and relative depth of structures 730 can be altered in accord with the needs of a specific application. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
  a package substrate;
  a semiconductor device die, comprising first and second opposing major surfaces, the first major surface mounted to the package substrate; and
  a heat spreader element, comprising first and second opposing major surfaces, wherein
    the heat spreader element is comprised of a thermally and electrically conductive material,
    a first portion of the first major surface of the heat spreader element is thermally coupled to the second major surface of the semiconductor device die,
    the heat spreader element comprises a plurality of structures formed on the second opposing major surface of the heat spreader element in a region opposing the portion of the first major surface coupled to the semiconductor device die, and the heat spreader element further comprises one or more openings formed through the heat spreader element in a portion of the semiconductor device package having an antenna structure.

2. The semiconductor device package of claim 1 further comprising:

a mold compound formed in a region between the first major surface of the heat spreader element and elements of the semiconductor device package mounted on the package substrate.

3. The semiconductor device package of claim 2, wherein the one or more openings in the heat spreader element expose a surface of the mold compound.

4. The semiconductor device package of claim 1 further comprising:

one or more antenna elements, mounted on the package substrate, and each located in a region under a corresponding opening in the heat spreader element, wherein each antenna element is configured to transmit an RF or wireless signal through the corresponding opening.

5. The semiconductor device package of claim 1 further comprising:

one or more antenna elements, formed from the thermally and electrically conductive material, each located in a region of a corresponding opening in the heat spreader element, wherein each antenna element is configured to transmit an RF or wireless signal.

6. The semiconductor device package of claim 5, wherein the one or more antenna elements are formed during an etching process of the heat spreader element, and the plurality of structures are formed during the etching process of the heat spreader element.

7. The semiconductor device package of claim 1 wherein the heat spreader element further comprises:

one or more shield structures formed on a second portion of the first major surface of the heat spreader element, wherein the shield structures are configured to electromagnetically shield the semiconductor device die, and the shield structures are formed from the heat spreader material.

8. The semiconductor device package of claim 1 further comprising:

a thermally-conductive material between the semiconductor device die and the first portion of the first major surface of the heat spreader element.

9. A semiconductor device package comprising:

a portion of a first major surface of a heat spreader element thermally coupled to an exposed surface of a semiconductor device die of a semiconductor device, a second major surface of the heat spreader element comprising selective plating in a region opposite the portion of the first major surface of the heat spreader element in thermal contact with the semiconductor device die, the selectively plated portion of the second major surface including one or more etched structures, the semiconductor device comprises one or more antenna structures, and the heat spreader element further includes one or more openings formed through the portion of the first major surface to the portion of the second major surface of the heat spreader element in a region above each of the one or more antenna structures;

a mold compound disposed in a gap region between the first major surface of the heat spreader element and an exposed surface of the semiconductor device.

10. The semiconductor device package of claim 9, further comprising:

a thermally conductive material disposed between the exposed surface of the semiconductor device die and the portion of the first major surface of the heat spreader element.

11. The semiconductor device package of claim 9, wherein:

the semiconductor device comprises one or more antenna contacts, and the second major surface of the heat spreader element comprises antenna selective plating in regions corresponding to the one or more antenna contacts.

12. The semiconductor device package of claim 9, wherein:

the heat spreader element is formed from a thermally-conductive metal.

13. The semiconductor device package of claim 9, wherein:

the heat spreader element further comprises one or more shielding structures on the first major surface of the heat spreader element.

14. The semiconductor device package of claim 13, wherein:

the one or more shielding structures are configured to provide electromagnetic shielding between devices comprised on a substrate of the semiconductor device package.

15. The semiconductor device package of claim 9, wherein:

the one or more etched structures are configured to enhance thermal dissipation characteristics of the heat spreader.

16. The semiconductor device package of claim 9, further comprising:

a plurality of contacts attached to a bottom-side major surface of the semiconductor device package.

17. A semiconductor device package comprising:

a package substrate;

a semiconductor device die, comprising first and second opposing major surfaces, the first major surface mounted to the package substrate;

one or more antenna structures mounted on the package substrate; and a heat spreader element, comprising first and second opposing major surfaces, wherein the heat spreader element is comprised of a thermally and electrically conductive material, a first portion of the first major surface of the heat spreader element is thermally coupled to the second major surface of the semiconductor device die, the heat spreader element comprises a plurality of structures formed on the second opposing major surface of the heat spreader element in a region opposing the portion of the first major surface coupled to the semiconductor device die, and the heat spreader element further comprises one or more openings formed through the first portion of the first major surface to the second opposing major surface of the heat spreader element in a region above each of the one or more antenna structures.

18. The semiconductor device package of claim 17 further comprising:
a mold compound formed in a region between the first major surface of the heat spreader element and elements of the semiconductor device package mounted on the package substrate.

19. The semiconductor device package of claim 18, wherein the one or more openings in the heat spreader element expose a surface of the mold compound.

20. A semiconductor device package comprising:
a portion of a first major surface of a heat spreader element thermally coupled to an exposed surface of a semiconductor device die of a semiconductor device, a second major surface of the heat spreader element comprising selective plating in a region opposite the portion of the first major surface of the heat spreader element in thermal contact with the semiconductor device die, the selectively plated portion of the second major surface including one or more etched structures, the semiconductor device comprises one or more antenna contacts, and the second major surface of the heat spreader element comprises antenna selective plating in regions corresponding to the one or more antenna contacts; and
a mold compound disposed in a gap region between the first major surface of the heat spreader element and an exposed surface of the semiconductor device.

\* \* \* \* \*